US011824636B2

(12) United States Patent
He et al.

(10) Patent No.: US 11,824,636 B2
(45) Date of Patent: *Nov. 21, 2023

(54) METHOD AND APPARATUS FOR SENDING AND RECEIVING CLOCK SYNCHRONIZATION PACKET

(71) Applicant: HUAWEI TECHNOLOGIES CO., LTD., Guangdong (CN)

(72) Inventors: Xiang He, Beijing (CN); Yunlei Qi, Dongguan (CN); Jingfeng Chen, Dongguan (CN); Tao Lin, Shenzhen (CN); Junmin Song, Dongguan (CN); Xinyuan Wang, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/833,862

(22) Filed: Jun. 6, 2022

(65) Prior Publication Data
US 2022/0303035 A1 Sep. 22, 2022

Related U.S. Application Data

(63) Continuation of application No. 16/847,258, filed on Apr. 13, 2020, now Pat. No. 11,356,188, which is a (Continued)

(51) Int. Cl.
*H04J 3/06* (2006.01)
*H03M 9/00* (2006.01)
(Continued)

(52) U.S. Cl.
CPC ............ *H04J 3/0667* (2013.01); *H03M 9/00* (2013.01); *H04J 3/0632* (2013.01);
(Continued)

(58) Field of Classification Search
CPC ....... H04J 3/06–0697; H04J 3/16–1694; H04J 2203/0085; H04L 69/32–329; H04L 7/00–0095; H04W 56/00–0095
See application file for complete search history.

(56) References Cited

U.S. PATENT DOCUMENTS 8,971,352 B2 3/2015 Jost
9,300,421 B2 3/2016 Yang et al.
(Continued)

FOREIGN PATENT DOCUMENTS

CN 101335587 A 12/2008
CN 101977104 A 2/2011
(Continued)

*Primary Examiner* — Chi H Pham
*Assistant Examiner* — Vladislav Y Agureyev
(74) *Attorney, Agent, or Firm* — James Anderson Harrison

(57) ABSTRACT

This disclosure provides a method for sending and receiving a clock synchronization packet in FlexE. The method includes: generating, by a sending apparatus, indication information and a plurality of data blocks, where the plurality of data blocks are obtained by encoding a first clock synchronization packet, the indication information is used to indicate a first data block, and the first data block is a data block used for timestamp sampling in the plurality of data blocks; determining, by the sending apparatus, according to the indication information, a moment at which the first data block arrives at a medium dependent interface MDI of the sending apparatus, and generating a sending timestamp, where the sending timestamp is used to record a sending moment of the first clock synchronization packet; generating a second clock synchronization packet carrying the sending timestamp; and sending, by the sending apparatus, the second clock synchronization packet.

29 Claims, 13 Drawing Sheets

Related U.S. Application Data continuation of application No. PCT/CN2017/106151, filed on Oct. 13, 2017.

(51) Int. Cl.
  *H04J 3/16* (2006.01)
  *H04L 69/323* (2022.01)

(52) U.S. Cl.
  CPC .......... *H04J 3/0688* (2013.01); *H04J 3/1658* (2013.01); *H04L 69/323* (2013.01)

(56) References Cited

U.S. PATENT DOCUMENTS

| | | |
|---|---|---|
| 2008/0075122 A1 | 3/2008 | Fourcand |
| 2008/0075128 A1 | 3/2008 | Fourcand |
| 2010/0034191 A1 | 2/2010 | Schulz |
| 2012/0047278 A1 | 2/2012 | Groos et al. |
| 2012/0131378 A1 | 5/2012 | Jiang et al. |
| 2013/0003757 A1 | 1/2013 | Boatright et al. |
| 2013/0089090 A1 | 4/2013 | Binetti et al. |
| 2013/0216218 A1 | 8/2013 | Cao et al. |
| 2013/0235865 A1 | 9/2013 | Eum et al. |
| 2014/0211780 A1 | 7/2014 | Kang et al. |
| 2014/0212142 A1 | 7/2014 | Doniec et al. |
| 2015/0067108 A1 | 3/2015 | Mamidwar et al. |
| 2015/0340009 A1 | 11/2015 | Loeffler et al. |
| 2016/0285575 A1 | 9/2016 | Holmeide |
| 2017/0005949 A1 | 1/2017 | Gareau |
| 2017/0093757 A1 | 3/2017 | Gareau et al. |
| 2018/0167160 A1 | 6/2018 | Gareau et al. |
| 2018/0227080 A1 | 8/2018 | Stein et al. |
| 2018/0227147 A1 | 8/2018 | Kataoka et al. |
| 2018/0375800 A1 | 12/2018 | Gareau et al. |
| 2019/0059066 A1 | 2/2019 | Harmatos et al. |
| 2019/0089615 A1 | 3/2019 | Branscomb et al. |
| 2019/0104419 A1* | 4/2019 | Barzegar .................. H01P 3/16 |
| 2020/0287998 A1 | 9/2020 | Gorshe et al. |
| 2021/0203428 A1 | 7/2021 | Bordogna et al. |

FOREIGN PATENT DOCUMENTS

| | | | | |
|---|---|---|---|---|
| CN | 104993897 A | 10/2015 | | |
| CN | 105577349 A | 5/2016 | | |
| CN | 102907021 B | 6/2016 | | |
| CN | 106850465 A | 6/2017 | | |
| CN | 108880722 A * | 11/2018 | .......... | H04J 14/0227 |
| EP | 3113502 A1 * | 1/2017 | ............ | G06F 13/40 |
| EP | 3113502 A1 | 1/2017 | | |
| EP | 3713158 A1 * | 9/2020 | ............ | H04J 3/1658 |

\* cited by examiner

| Overhead block number | SH | 0 | 1 | 2 | 3 | 4 | 5 | 6 | 7 | 8 | 9 | 10 | 11 | 12-15 | 16-19 | 20-35 | 36-63 |
|---|---|---|---|---|---|---|---|---|---|---|---|---|---|---|---|---|---|
| 1 | 1 | 0 | | | | | | | | OMF | RPF | SC | | 0x4B | FlexE mapping | FlexE bundling group number | 0x000_0000 |
| 2 | 0 | 1 | C | | | | | | | | | | | FlexE instance number | | 0x5 | Reserved |
| 3 | 0 | 1 | C | | | | | | | | | | | Client slot configuration table A (Client calendar A) | | Client slot configuration table B (Client calendar B) | CR CA Reserved CRC-16 |
| 4 | s | s | | | | | | | | | | | | | | Management channel | |
| 5 | s | s | | | | | | | | | | | | | | Management channel | |
| 6 | s | s | | | | | | | | | | | | | | Management channel | |
| 7 | s | s | | | | | | | | | | | | | | | |
| 8 | s | s | | | | | | | | | | | | | | | |

FIG. 7

METHOD AND APPARATUS FOR SENDING AND RECEIVING CLOCK SYNCHRONIZATION PACKET

CROSS-REFERENCE TO RELATED APPLICATIONS

This application is a continuation of U.S. patent application Ser. No. 16/847,258, filed on Apr. 13, 2020, which is a continuation of International Application No. PCT/CN2017/106151, filed on Oct. 13, 2017, the disclosure of which is hereby incorporated by reference in its entirety.

TECHNICAL FIELD

This application relates to the communications field, and in particular, to a method and an apparatus for sending a clock synchronization packet, and a method and an apparatus for receiving a clock synchronization packet.

BACKGROUND

Flexible ethernet (FlexE) is ethernet developed based on conventional ethernet. The FlexE defines a variable rate interface between a router and an optical transport network (OTN), and is mainly used to simplify mapping and transmission modes of an ethernet interface in the OTN as far as possible. The FlexE can implement a greater transmission rate and a wider transmission bandwidth based on a rate binding technology and a flexible mapping mode between the ethernet interface and the OTN.

Clock synchronization is indispensable for both the conventional ethernet and the FlexE. The prior art implements clock synchronization between different devices by using a precision time protocol (PTP) packet. In the FlexE, a clock synchronization method is to transmit a PTP packet through a management channel of an overhead frame. However, this clock synchronization method has many limitations. For example, a format of the overhead frame and a bandwidth occupied by the overhead frame are fixed, thereby limiting clock synchronization frequency and a bandwidth that can be used for transmitting a PTP packet and limiting scalability of the FlexE.

SUMMARY

This disclosure provides a method and an apparatus for sending and receiving a clock synchronization packet in FlexE, to increase clock synchronization frequency, increase a bandwidth that can be used for transmitting a clock synchronization packet, and reduce clock synchronization complexity. In addition, compared with the method in the background, the method and the apparatus for sending and receiving a clock synchronization packet provided in this disclosure are compatible with an existing clock synchronization standard.

According to a first aspect, a method for sending a clock synchronization packet is provided. The method includes: generating, by a sending apparatus, indication information and a plurality of data blocks, where the plurality of data blocks are obtained by encoding a first clock synchronization packet, the indication information is used to indicate a first data block, and the first data block is a data block used for timestamp sampling in the plurality of data blocks; determining, by the sending apparatus, according to the indication information, a moment at which the first data block arrives at a medium dependent interface MDI of the sending apparatus, and generating a sending timestamp, where the sending timestamp is used to record a sending moment of the first clock synchronization packet; generating, by the sending apparatus, a second clock synchronization packet carrying the sending timestamp; and sending, by the sending apparatus, the second clock synchronization packet.

In order to improve clock synchronization precision, the data block used for timestamp sampling is pre-agreed by the sending apparatus and a receiving apparatus and cannot be selected at random. In conventional ethernet, a sequence in which data blocks arrive at the MDI of the sending apparatus does not change. In FlexE, because the data blocks arrive at the MDI in a disordered sequence after being mapped by a time division multiplexing layer, the sending apparatus cannot determine which data block is pre-agreed. Therefore, the industry believes that the FlexE cannot use the clock synchronization method in the conventional ethernet. In the method provided in this embodiment, the sending apparatus indicates, by using the indication information, the data block used for timestamp sampling, so that the sending apparatus can identify the appointed data block from a plurality of data blocks arriving at the MDI. Therefore, the clock synchronization method in the conventional ethernet can be applied to the FlexE to overcome the technical bias of the industry. Because a clock synchronization packet may be carried in a non-overhead frame, a quantity of non-overhead frames is far greater than a quantity of overhead frames. Therefore, compared with the FlexE clock synchronization method in the background, the clock synchronization method provided in this embodiment is characterized by high clock synchronization frequency and a wide bandwidth that can be used for transmitting a clock synchronization packet.

Optionally, the first data block is a data block including a start-of-frame delimiter SFD of the first clock synchronization packet in the plurality of data blocks.

In the method provided in this embodiment, the data block corresponding to the SFD is used as a sampling data block for the sending timestamp. The method is the same as a sending timestamp sampling method in the conventional ethernet, thereby improving compatibility of the FlexE clock synchronization method.

Optionally, the second clock packet is carried in a client payload of the FlexE.

In the method provided in this embodiment, the clock synchronization packet is sent by using the client payload of the FlexE. The method is the same as a method for sending a clock synchronization packet in the conventional ethernet, thereby improving compatibility of the FlexE clock synchronization method.

According to a second aspect, a method for receiving a clock synchronization packet is provided, including: receiving, by a receiving apparatus, a plurality of data blocks, where the plurality of data blocks are data blocks generated by encoding a clock synchronization packet; generating, by the receiving apparatus, a plurality of receipt timestamps, where the plurality of receipt timestamps are used to record receiving moments of the plurality of data blocks; decoding, by the receiving apparatus, the plurality of data blocks, and reconstructing the clock synchronization packet; and writing, by the receiving apparatus, a receipt timestamp of a first data block into the clock synchronization packet, where the first data block is a data block corresponding to preset information in the clock synchronization packet.

In order to improve clock synchronization precision, a data block used for timestamp sampling is pre-agreed by a sending apparatus and the receiving apparatus and cannot be selected at random. In conventional ethernet, a sequence in which data blocks arrive at an MDI of the receiving apparatus does not change. In FlexE, because the data blocks arrive at the MDI of the receiving apparatus in a disordered sequence after being mapped by a time division multiplexing layer in the sending apparatus, the receiving apparatus cannot determine which data block is a pre-agreed data block used for receipt timestamp sampling. Therefore, the industry believes that the FlexE cannot use the clock synchronization method in the conventional ethernet. In the method provided in this embodiment, the receiving apparatus performs timestamp sampling on a data block received in each receive period. After the clock synchronization packet is restored, a timestamp of the data block corresponding to the preset information is used as a receipt timestamp of the clock synchronization packet, to complete receipt timestamp sampling of the clock synchronization packet. Therefore, the clock synchronization method in the conventional ethernet can be applied to the FlexE to overcome the technical bias of the industry. Because the clock synchronization packet may be carried in a non-overhead frame, a quantity of non-overhead frames is far greater than a quantity of overhead frames. Therefore, compared with the FlexE clock synchronization method in the background, the clock synchronization method provided in this embodiment is characterized by high clock synchronization frequency and a wide bandwidth that can be used for transmitting a clock synchronization packet.

Optionally, the preset information is an SFD of the clock synchronization packet.

In the method provided in this embodiment, a data block corresponding to the SFD is used as a sampling data block for the receipt timestamp. The method is the same as a receipt timestamp sampling method in the conventional ethernet, thereby improving compatibility of the FlexE clock synchronization method.

Optionally, a quantity of the plurality of receipt timestamps is less than a quantity of the plurality of data blocks. Before the writing, by the receiving apparatus, a receipt timestamp of a first data block into the clock synchronization packet, the method further includes: recording, by the receiving apparatus, a quantity of bits separated between each of the plurality of data blocks and a reference data block, where the reference data block is a data block whose receiving moment is recorded in the plurality of data blocks; and determining, by the receiving apparatus, the receipt timestamp of the first data block based on a correspondence between a time and a quantity of bits, a quantity of bits separated between the first data block and the reference data block, and a receipt timestamp of the reference data block.

Because data received by the receiving apparatus in each receive period may include a plurality of data blocks, that is, the plurality of data blocks share one receipt timestamp, the data block whose receiving moment is recorded is referred to as the reference data block. In the method provided in this embodiment, the quantity of bits separated between each data block and the reference data block is recorded, and therefore a receiving moment of the first data block may be obtained through calculation based on a correspondence between a bit and a time, in other words, the receipt timestamp of the first data block is determined. In addition, even if a timestamp sampling point in the reference data block is deleted, a location of the timestamp sampling point can be continuously tracked in the method provided in this disclosure.

Optionally, a moment corresponding to any one of the plurality of receipt timestamps is a moment at which a first bit is received in one receive period.

The SFD is a field to be sent first and to be received first in the clock synchronization packet. In the conventional ethernet, the SFD is used as a reference point to perform timestamp sampling. Therefore, the first bit received in the receive period is used as a timestamp sampling point, thereby improving compatibility of the FlexE clock synchronization method.

Optionally, duration of the receive period is equal to a time required by the receiving apparatus for receiving X-bit data, X is a value of a smaller bit width in a bus bit width and a buffer bit width of the receiving apparatus, and the buffer bit width is a buffer bit width of a serial-parallel conversion port of the receiving apparatus.

A smaller bit width indicates a shorter receive period and higher sampling frequency of a receipt timestamp. This is beneficial to improve precision of a finally determined receipt timestamp of the clock synchronization packet.

Optionally, the clock packet is carried in a client payload of the FlexE.

In the method provided in this embodiment, the clock synchronization packet is received by using the client payload of the FlexE. The method is the same as a method for receiving a clock synchronization packet in the conventional ethernet, thereby improving compatibility of the FlexE clock synchronization method.

According to a third aspect, an apparatus for sending a clock synchronization packet is provided. The apparatus can implement a function performed by the sending apparatus in the method in the first aspect. The function may be implemented by using hardware, or may be implemented by hardware executing corresponding software. The hardware or software includes one or more units or modules corresponding to the foregoing function.

In a possible design, a structure of the apparatus includes a processor and a communications interface. The processor is configured to support the apparatus in performing the corresponding function in the method in the first aspect. The communications interface is configured to support communication in the apparatus and communication between the apparatus and another apparatus. The apparatus may further include a memory. The memory is configured to be coupled to the processor, and the memory stores a program instruction and data that are necessary for the apparatus.

According to a fourth aspect, an apparatus for receiving a clock synchronization packet is provided. The apparatus can implement a function performed by the receiving apparatus in the method in the second aspect. The function may be implemented by using hardware, or may be implemented by hardware executing corresponding software. The hardware or software includes one or more units or modules corresponding to the foregoing function.

In a possible design, a structure of the apparatus includes a processor and a communications interface. The processor is configured to support the apparatus in performing the corresponding function in the method in the second aspect. The communications interface is configured to support communication in the apparatus and communication between the apparatus and another apparatus. The apparatus may further include a memory. The memory is configured to be coupled to the processor, and the memory stores a program instruction and data that are necessary for the apparatus.

According to a fifth aspect, this disclosure further provides a network system, and the network system includes the apparatus for sending a clock synchronization packet in the third aspect and the apparatus for receiving a clock synchronization packet in the fourth aspect.

According to a sixth aspect, a computer readable storage medium is provided. The computer readable storage medium stores computer program code. When the computer program code is executed by a processing unit or a processor, a sending apparatus is enabled to perform the method in the first aspect.

According to a seventh aspect, a computer readable storage medium is provided. The computer readable storage medium stores computer program code. When the computer program code is executed by a processing unit or a processor, a receiving apparatus is enabled to perform the method in the second aspect.

According to an eighth aspect, a chip is provided, and the chip stores an instruction. When the instruction runs on a sending apparatus, the chip is enabled to perform the method in the first aspect.

According to a ninth aspect, a chip is provided, and the chip stores an instruction. When the instruction runs on a receiving apparatus, the chip is enabled to perform the method in the second aspect.

According to a tenth aspect, a computer program product is provided, and the computer program product includes computer program code. When the computer program code is run by a communications unit or a communications interface and a processing unit or a processor of a sending apparatus, the sending apparatus is enabled to perform the method in the first aspect.

According to an eleventh aspect, a computer program product is provided, and the computer program product includes computer program code. When the computer program code is run by a communications unit or a communications interface and a processing unit or a processor of a receiving apparatus, the sending apparatus is enabled to perform the method in the second aspect.

BRIEF DESCRIPTION OF DRAWINGS

FIG. 7 is a schematic diagram of a structure of a FlexE overhead frame applicable to this application;

DESCRIPTION OF EMBODIMENTS

The following describes technical solutions in this disclosure with reference to accompanying drawings.

In conventional ethernet, after passing through a switching board, a service flow usually sequentially passes through modules or components such as a traffic management (TM) module, a network processing unit (NPU), a medium access control (MAC) layer module, and a physical layer module (referred to as a "PHY" below) for processing.

The TM module performs quality of service (QoS) processing on the service flow based on an available bandwidth of a network and a priority of the service flow. For example, if the available bandwidth of the network is insufficient to transmit all service flows, the TM module may transmit a service flow with a high priority and perform packet discarding processing on a service flow with a low priority.

The NP is a chip for processing an ethernet service and is configured to perform processing on an ethernet frame. The processing on the ethernet frame includes parsing of the ethernet frame and a route lookup.

The MAC layer module is mainly responsible for connecting and controlling a physical medium at a physical layer. For an ethernet service packet, physical layer information may be encapsulated and decapsulated at the physical layer.

The PHY may be defined as providing mechanical, electronic, functional, and normative characteristics for establishing, maintaining, and removing a physical link required for data transmission. The PHY mentioned in this specification may include physical layer working components at a transmit end and a receive end, and an optical fiber between the transmit end and the receive end. The physical layer working components may include, for example, a physical layer interface device in the ethernet.

Figure 1:
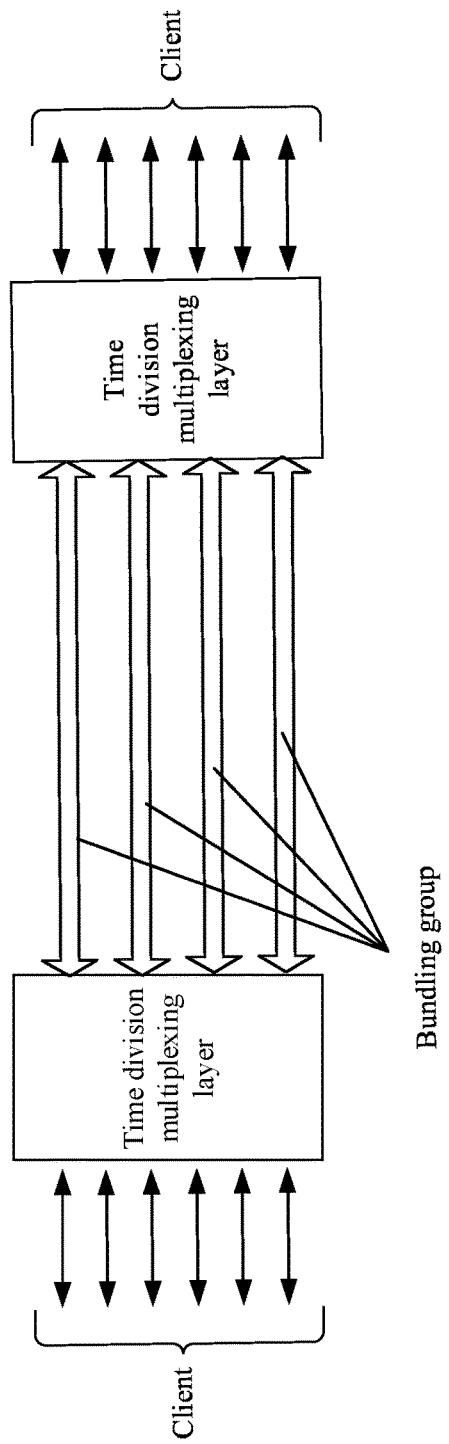
FIG. 1 is a schematic diagram of a general architecture of FlexE.

Referring to FIG. 1, new concepts such as a bundling group, a flexible ethernet client (FlexE client, "client" for short below), a timeslot configuration table (calendar), and a flexible ethernet time division multiplexing layer (FlexE shim, "time division multiplexing layer" for short below) are introduced to FlexE based on conventional ethernet.

Bundling group: The bundling group may include a plurality of PHYs, for example, may include 1 to 256 PHYs that support a rate of 100 gigabit ethernet (GE).

Client: The client may be considered as an ethernet flow based on a physical address. Clients sent by using a same bundling group need to share a same clock, and adaptation needs to be performed on these clients based on an allocated timeslot rate. Bandwidth overheads of each client may be adapted by inserting/deleting an idle block (idle).

Timeslot: A bandwidth resource of one PHY is usually divided into a plurality of timeslots (for example, 20 timeslots). During actual use, service data is first encapsulated into a timeslot, and then the timeslot is mapped to a PHY in a bundling group. A mapping relationship between a timeslot and a PHY is recorded in a timeslot configuration table of the FlexE. The FlexE usually supports two timeslot configuration tables. One timeslot configuration table is currently being used, and the other timeslot configuration table may be on standby. Mutual switching may be performed between the two timeslot configuration tables. A specific switching occasion may be negotiated by upstream and downstream, and synchronous switching is performed. In this way, when a service configuration of a client changes, a service of another client is not affected.

Time division multiplexing layer: The time division multiplexing layer is mainly used to perform slicing on service data based on a same clock, encapsulate sliced service data into timeslots obtained through predivision, and then map timeslots obtained through division to PHYs in a bundling group based on a preconfigured timeslot configuration table (which may be specifically configured by a user) for transmission. Each timeslot is mapped to one PHY in the bundling group.

As a technology based on time division multiplexing (TDM), the FlexE breaks all ethernet packets into data blocks with a size of 64B/66B ("B" is short for "bit") and maps these data blocks to a plurality of different PHYs based on a timeslot. Taking a 100 GE PHY as an example, each 100 GE PHY corresponds to 20 64B/66B code blocks and each code block corresponds to a payload rate of 5 gigabits per second (Gbps). In this new network architecture, a time sequence in which data blocks arrive at a receiving apparatus changes. However, a premise of applying a clock synchronization technology in the conventional ethernet is that the time sequence in which the data blocks arrive at the receiving apparatus does not change. Therefore, it is particularly difficult to apply the clock synchronization technology in the conventional ethernet to the FlexE. This difficulty is subsequently analyzed in detail in this specification.

For ease of understanding the technical solutions in this disclosure, some technical features in this disclosure are explained and illustrated below.

Figure 2:
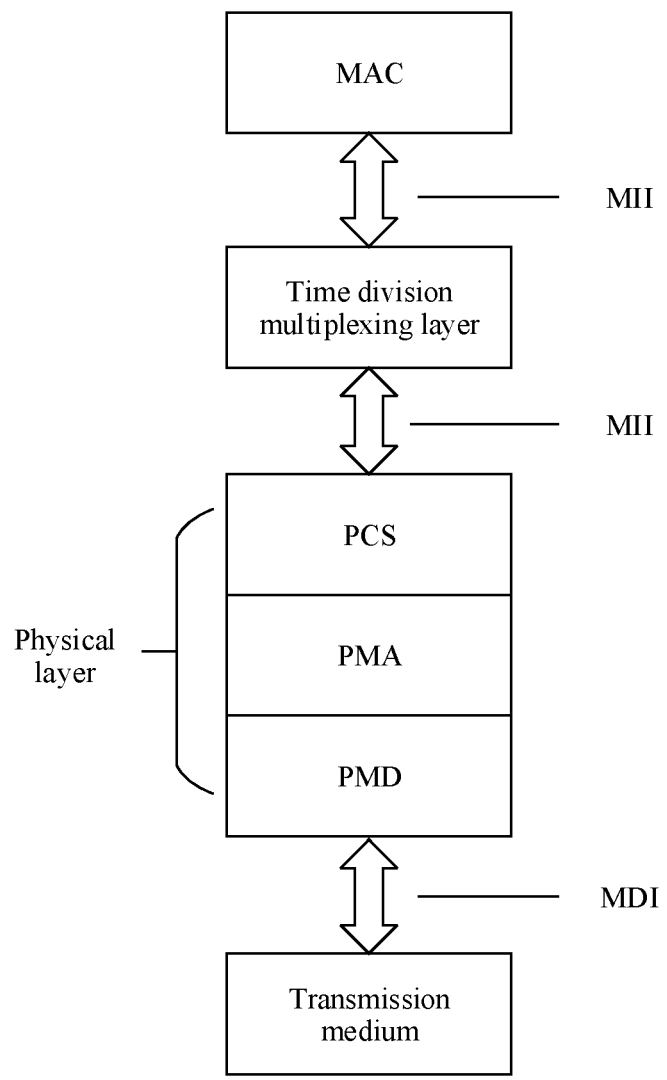
FIG. 2 is a schematic diagram of a partial FlexE architecture applicable to this disclosure.

FIG. 2 is a schematic diagram of a partial FlexE architecture applicable to this disclosure.

As shown in FIG. 2, the partial FlexE architecture includes a MAC sublayer, a time division multiplexing layer, and a physical layer. The MAC sublayer is a sublayer of a data link layer and is connected to the top of a logical link control sublayer. The physical layer may be further divided into a physical coding sublayer (PCS), a physical medium attachment (PMA) sublayer, and a physical medium dependent (PMD) sublayer. The MAC sublayer and the time division multiplexing layer, and the time division multiplexing layer and the physical layer are separately connected by using a medium independent interface (MII). The physical layer is connected to the bottom of a transmit medium by using a medium dependent interface (MDI). Functions of the forgoing layers and interfaces are implemented by corresponding chips or modules. For example, corresponding functions of the PCS, the PMA sublayer, and the PMD sublayer may be separately implemented by different PHYs.

Because data passing through a same MAC module has a same MAC address, the MAC module is a FlexE client. In a process of sending a signal, the PCS is configured to perform operations on data, for example, encoding, scrambling, inserting an overhead header (OH), and inserting an alignment marker (AM). In a process of receiving a signal, the PCS performs a reverse processing process of the forgoing steps. Signal sending and signal receiving may be implemented by different functional modules of the PCS.

Main functions of the PMA sublayer are link monitoring, subcarrier monitoring, encoding and decoding, transmit clock synthesis, and receive clock restoration. Main functions of the PMD sublayer are scrambling/descrambling of a data flow, encoding and decoding, and performing direct current restoration and adaptive equalization on a received signal.

It should be understood that the forgoing architecture is merely an example for illustration and a FlexE architecture applicable to this disclosure is not limited thereto. For example, there may be a reconciliation sublayer (RS) between the MAC sublayer and the time division multiplexing layer and the reconciliation sublayer is configured to provide a signal mapping mechanism between the MII and the MAC sublayer. There may be a forward error correction (FEC) sublayer between the PCS and the PMA sublayer and the forward error correction sublayer is configured to enhance data sending reliability.

Figure 3:
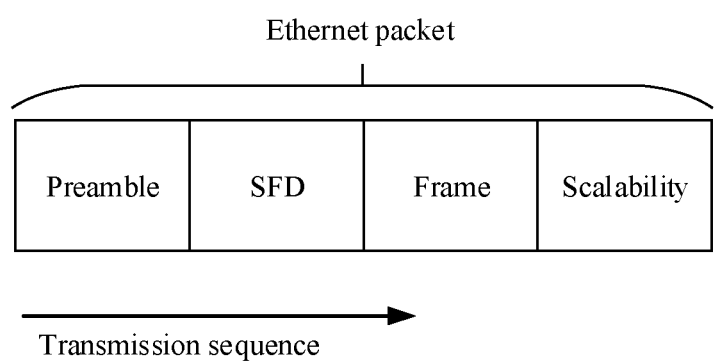
FIG. 3 is a schematic diagram of a data packet format of an ethernet packet.

FIG. 3 shows a structure of an ethernet packet and a location of a start-of-frame delimiter (SFD) in the ethernet packet. An ethernet packet includes a preamble with seven octets (octet), an SFD with one octet, and a frame with a variable length. The SFD and the preamble are usually located at a data block with a size of 66B. The ethernet packet is sent in a left-to-right sequence shown in FIG. 3. That is, the preamble is first sent, then the SFD is sent, and finally the frame is sent. In an actual sending process, a least significant bit (LSB) is first sent and then a most significant bit (MSB) is sent. Therefore, in the actual sending process, the SFD is a part that is first sent in the entire ethernet packet.

In a clock synchronizing process of the conventional ethernet, a sending apparatus uses a moment at which a data block corresponding to an SFD arrives at an MDI through a PMA sublayer as a sending timestamp of a clock synchronization packet. Because transmission is performed by using a single PHY in the conventional ethernet and the conventional ethernet has no time division multiplexing layer shown in FIG. 2, a time sequence in which the data block arrives at a receiving apparatus does not change, and the MDI of the sending apparatus may identify the data block corresponding to the clock synchronization packet and stamp a timestamp on the data block. The receiving apparatus may identify the data block corresponding to the SFD of the clock synchronization packet and record the SFD of the clock synchronization packet.

As shown in FIG. 1, data is transmitted by using a plurality of PHYs in the FlexE. In addition, in the FlexE, data blocks are mapped to different PHYs by using the time division multiplexing layer shown in FIG. 2, thereby disrupting a sequence of the data blocks. In the clock synchronization method in the conventional ethernet, a timestamp sampling module of the sending apparatus and a timestamp sampling module of the receiving apparatus cannot determine the SFD of the clock synchronization packet, and consequently clock synchronization cannot be performed.

The following describes in detail difficulties of applying the clock synchronization technology in the conventional ethernet to the FlexE.

Figure 4:
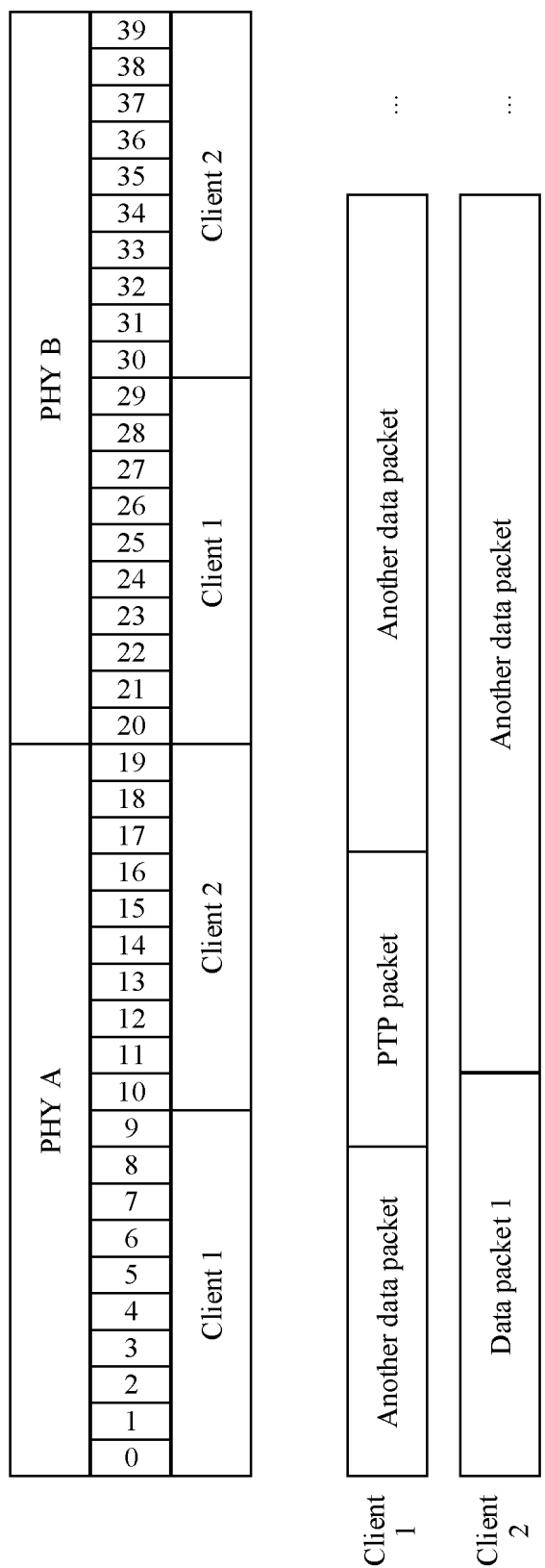
FIG. 4 is a schematic diagram of a method for transmitting a packet by using two PHYs.

FIG. 4 is a schematic diagram of a method for transmitting a packet by using two PHYs. As shown in FIG. 4, a PHY A and a PHY B are two physical links and belong to a 2×100 GE FlexE bundling group. Based on the FlexE bundling group, there are two 100 Gbps clients: a client 1 and a client 2.

A bandwidth of each PHY may correspond to 20 timeslots. The FlexE bundling group corresponds to 40 timeslots in total and the 40 timeslots are numbered as a timeslot 0 to a timeslot 39. A timeslot mapping mode of the two clients is shown in FIG. 4. The client 1 occupies timeslots 0 to 9 and timeslots 20 to 29, and the client 2 occupies timeslots 10 to 19 and timeslots 30 to 39. An ethernet packet sent by the client 1 includes a PTP packet, an ethernet packet sent by the client 2 includes a data packet 1, and the data packet 1 is a non-PTP packet. The packets of the client 1 and the client 2 are sent in a left-to-right sequence shown in FIG. 4 and the timeslots are sequentially allocated in ascending order of timeslot numbers.

Figure 5:
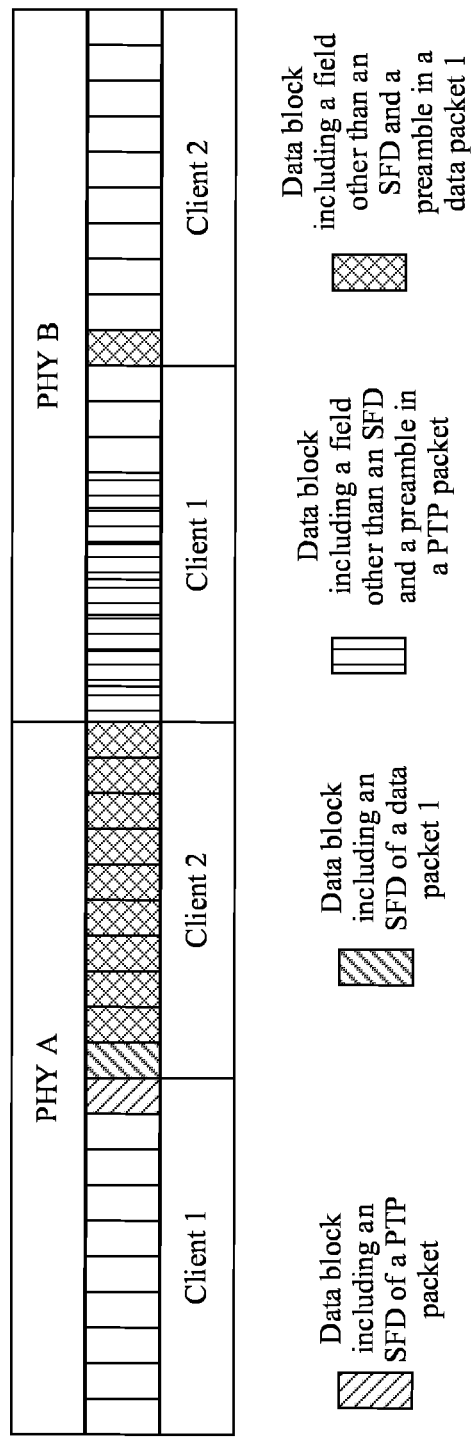
FIG. 5 is a schematic diagram of a result of mapping a dual-client data packet on two PHYs.

After the timeslot allocation, locations of the PTP packet and the data packet 1 in two PHYs are shown in FIG. 5. A first data block of the PTP packet occupies a timeslot 9, and it can be learned from FIG. 3 that the data block is a data block corresponding to an SFD of the PTP packet. A data block corresponding to an SFD of the data packet 1 occupies a timeslot 10. It can be learned that two data blocks corresponding to SFDs consecutively appear in the PHY A. For a sending apparatus, because a timestamp sampling module cannot identify which data block is the data block corresponding to the SFD of the PTP packet, a timestamp cannot be stamped. To say the least, even if the sending apparatus identifies the data block corresponding to the SFD of the PTP packet and stamps a timestamp on the data block, because the data block of the PTP packet arrives at a receiving apparatus in a disordered sequence, the receiving apparatus cannot determine the data block corresponding to the SFD of the PTP packet and therefore cannot stamp a timestamp.

FIG. 4 and FIG. 5 are merely a simple example. In actual application, a larger quantity of clients and a larger quantity of PHYs bring about a more complicated scenario, and it is more difficult to identify the data block corresponding to the SFD of the PTP packet.

In addition to the difficulty described above, because a time division multiplexing layer of the FlexE inserts or deletes an idle block when rate adaption is performed on a client and then needs to perform mapping between a code block and a timeslot and mapping between a timeslot and a physical channel, this process changes a relative location of the PTP packet in a data flow and the location of the PTP packet cannot be predicted through logic. In other words, the PTP packet in a transmission process is opaque and this is another huge difficulty of applying the clock synchronization technology in the conventional ethernet to the FlexE.

The FlexE clock synchronization method in the background is a totally different method from the clock synchronization technology in the conventional ethernet. The method can implement FlexE clock synchronization, but the method still has many disadvantages. The method and reasons for the disadvantages of the method are described in detail below.

Figure 6:
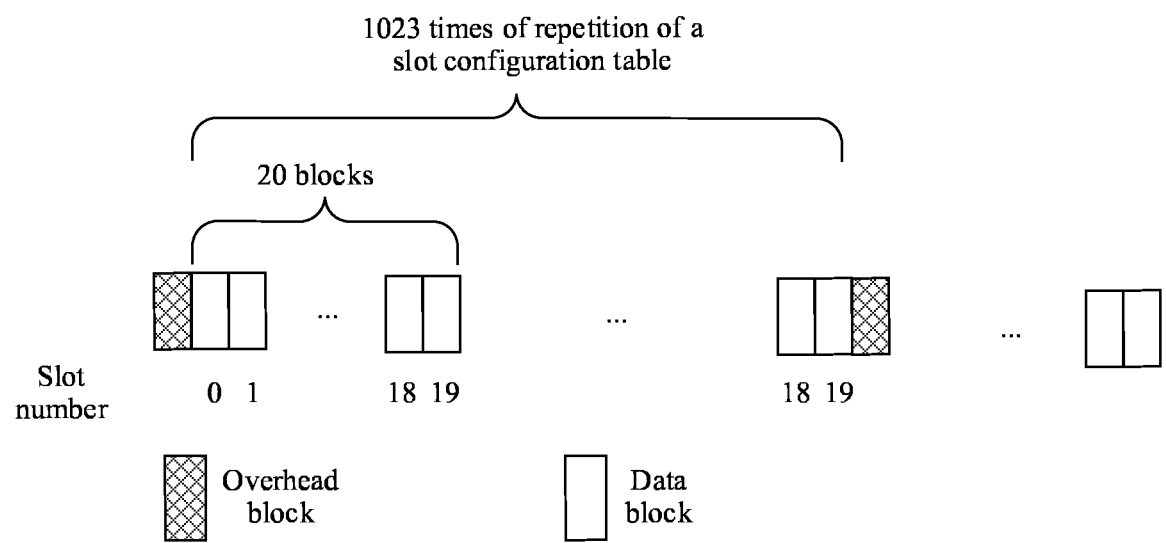
FIG. 6 is a schematic diagram of a FlexE frame format applicable to this disclosure.

A frame format of data processed by a PCS is shown in FIG. 6. One rectangle with a smallest area in FIG. 6 represents one data block (block). The data block is, for example, a data block encoded according to a provision of a clause 82 (clause 82) of the institute of electrical and electronics engineers (.IEEE) 802.3 standard. Each data block occupies one timeslot in a TDM mapping mechanism. Every 20 data blocks constitute one timeslot configuration table. After each timeslot configuration table is repeated 1023 times, one overhead block is inserted. Every eight overhead blocks constitute one overhead frame and every 32 overhead frames constitute one overhead multiframe. Client timeslot mapping of the entire FlexE and various management operations are completed by using an overhead multiframe. For example, that a receiving apparatus restores a PTP packet from a data block is completed based on the overhead multiframe.

FIG. 7 is a schematic diagram of a structure of a FlexE overhead frame applicable to this disclosure. Numbers 1 to 8 on the left side of FIG. 7 represent eight overhead blocks. Numbers 0 to 63 on a first overhead block represent timeslot numbers. The eight overhead blocks are actually serially arranged in a time sequence. For ease of reading, the eight overhead blocks are arranged in parallel in FIG. 7. In this disclosure, a "management channel" is specifically a fourth overhead block to an eighth overhead block of each overhead frame. For meanings of various identifiers in FIG. 7, refer to a definition of an overhead frame in the prior art. For brevity, details are not described herein.

In the FlexE clock synchronization method in the background, a PTP packet is carried in a sixth overhead block of the overhead frame shown in FIG. 7 and a timestamp is collected by using a frame header of an overhead frame or an overhead multiframe as a reference point. The FlexE clock synchronization method in the background can implement FlexE clock synchronization. However, this method is applicable only to a sending apparatus and a receiving apparatus that can identify the frame header of the overhead frame or the overhead multiframe. Besides, this method has many disadvantages.

The disadvantages of this method are specifically analyzed in detail below.

First, a bandwidth that can be used for transmitting a clock synchronization packet is restricted in this method. A bandwidth occupied by an overhead frame is fixed. Taking FlexE based on a 100 GE PHY as an example, a bandwidth corresponding to each 66B code block in a management channel is approximately 630 kilobits per second (kbps), that is, this bandwidth is a maximum bandwidth for transmitting a PTP packet on the management channel. In consideration of an extensive application scenario of the FlexE in the future, for example, a scenario in which frequency for transmitting a PTP packet is relatively high or a scenario in which a plurality of clock domains exist, a bandwidth requirement of a corresponding scenario is difficult to be met by transmitting a PTP packet through a management channel.

Second, selection frequency of a timestamp is restricted in this method. A format of an overhead frame is fixed, that is, occurrence frequency of a frame header of an overhead frame or an overhead multiframe is fixed. The frame header of the overhead frame or the overhead multiframe is used as a timestamp reference point in the forgoing clock synchronization method, thereby restricting selection frequency of a timestamp. For example, in the forgoing method, a management channel corresponding to eight overhead frames is required to complete transmission of one synchronization (sync) packet. A time occupied by each overhead frame is 838.4 microseconds (μs) and this interval is a minimum interval between two timestamps theoretically. Because there are often more restrictions in specific implementation, the interval between the two timestamps is far greater than 838.4 μs. For example, if a follow-up packet needs to be transmitted, eight overhead frames are further required. Scalability of the FlexE is further restricted in this method.

Third, clock synchronization complexity is increased in this method. For a mobile bearer network, synchronization information is carried in a client payload. According to the forgoing method, a device for sending a clock synchronization packet needs to first extract the clock synchronization packet from the payload and place the clock synchronization packet into a management channel. A device for receiving the clock synchronization packet needs to first extract the clock synchronization packet from the management channel and then place the clock synchronization packet into the client payload again. This apparently increases clock synchronization complexity and exerts negative impact on clock synchronization reliability Finally, this method is not compatible with an existing standard. In an IEEE 1588 standard and an IEEE 802.3 standard, when timestamp sampling is performed, an SFD is used as a timestamp reference point and a moment at which the SFD arrives at an MDI through a PMA sublayer is used as a timestamp.

A FlexE clock synchronization solution provided in this disclosure is described in detail below.

Figure 8:
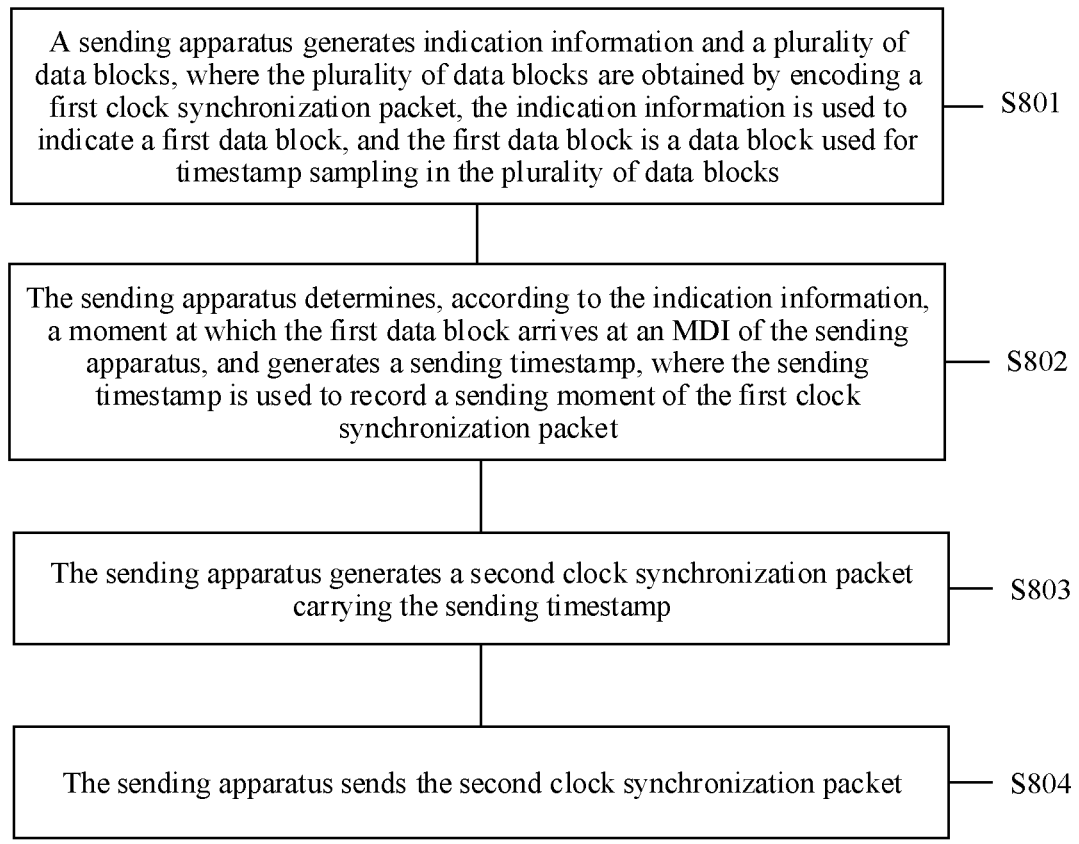
FIG. 8 is a schematic diagram of a method for sending a clock synchronization packet according to this application.

FIG. 8 shows a method for sending a clock synchronization packet according to this disclosure. The method 800 includes the following steps.

S801. A sending apparatus generates indication information and a plurality of data blocks, where the plurality of data blocks are obtained by encoding a first clock synchronization packet, the indication information is used to indicate a first data block, and the first data block is a data block used for timestamp sampling in the plurality of data blocks.

S802. The sending apparatus determines, according to the indication information, a moment at which the first data block arrives at an MDI of the sending apparatus, and generates a sending timestamp, where the sending timestamp is used to record a sending moment of the first clock synchronization packet.

S803. The sending apparatus generates a second clock synchronization packet carrying the sending timestamp.

S804. The sending apparatus sends the second clock synchronization packet.

In S801, the indication information may be out-of-band information. In an optional implementation, a cable is newly added to an existing chip or circuit. When the first data block is being sent, the out-of-band information is simultaneously generated and sent through the cable. The indication information may be alternatively a bit transmitted jointly with the first data block. In an optional implementation, when data blocks are being generated, a flag bit is attached to each data block. For example, a size of a data block generated by encoding the first clock synchronization packet is 66B, a PCS of the sending apparatus may generate a data block with a size of 67B, and an extra one bit is used to indicate whether the data block is the first data block. In an optional example, when the bit is 1, it indicates that the data block is the first data block. When the bit is 0, it indicates that the data block is a non-first data block.

It should be noted that in the sending apparatus, all modules between a MAC module and a serializer-deserializer (SerDes) track the first data block according to the indication information. The indication information may exist only in one form or may exist in a plurality of forms. Which form of indication information is used between the modules to track the first data block may be determined based on an actual situation. This is not limited in this disclosure.

When the first data block arrives at the SerDes, the SerDes sends a signal to a real time clock (RTC), and the RTC performs timestamp sampling, that is, the RTC records the moment at which the first data block arrives at the MDI. Because the first data block is a data block that is appointed by the sending apparatus and a receiving apparatus for timestamp sampling, this timestamp may be used as the sending timestamp of the first clock synchronization packet.

The RTC transmits the timestamp to the MAC module, and the MAC module generates the second clock synchronization packet carrying the timestamp and sends the second clock synchronization packet.

It should be understood that in the method 800, the first clock synchronization packet and the second clock synchronization packet may be PTP packets. For example, the first clock synchronization packet is a synchronization (sync) packet, and the second clock synchronization packet is a follow-up packet. However, the first clock packet and the second clock packet are not limited thereto, and may be alternatively a clock synchronization packet conforming to another clock synchronization protocol.

Based on the above analysis of the conventional ethernet clock synchronization solution and the FlexE clock synchronization solution in the background, it may be learned that to improve clock synchronization precision, the data block used for timestamp sampling is pre-agreed by the sending apparatus and the receiving apparatus and cannot be selected at random. In conventional ethernet, a sequence in which data blocks arrive at the MDI of the sending apparatus does not change. In FlexE, because the data blocks arrive at the MDI in a disordered sequence after being mapped by a time division multiplexing layer, the sending apparatus cannot determine which data block is pre-agreed. Therefore, the industry believes that the FlexE cannot use the clock synchronization method in the conventional ethernet. In the method provided in this embodiment, the sending apparatus indicates, by using the indication information, the data block used for timestamp sampling, so that the sending apparatus can identify the appointed data block from a plurality of data blocks arriving at the MDI. Therefore, the clock synchronization method in the conventional ethernet can be applied to the FlexE to overcome the technical bias of the industry. Because the clock synchronization packet may be carried in a non-overhead frame, a quantity of non-overhead frames is far greater than a quantity of overhead frames. Therefore, compared with the FlexE clock synchronization method in the background, the clock synchronization method provided in this embodiment is characterized by high clock synchronization frequency and a wide bandwidth that can be used for transmitting a clock synchronization packet.

Optionally, the first data block is a data block including an SFD of the first clock synchronization packet in the plurality of data blocks.

In the method provided in this embodiment, the data block corresponding to the SFD is used as a sampling data block for the sending timestamp. The method is the same as a sending timestamp sampling method in the conventional ethernet, thereby improving compatibility of the FlexE clock synchronization method.

Optionally, the second clock packet is carried in a client payload of the FlexE.

In the method provided in this embodiment, a clock synchronization packet may be carried by using an overhead block, or a clock synchronization packet may be sent by using the client payload of the FlexE.

When the clock synchronization packet is carried in the client payload (namely, a data block shown in FIG. 6), sending frequency of the clock synchronization packet is not restricted by a location of an overhead block and a bandwidth occupied by the overhead block. Therefore, compared with the FlexE clock synchronization method in the background, the method for sending a clock synchronization packet provided in this embodiment can greatly improve scalability of FlexE clock synchronization. In addition, the method for carrying a clock synchronization packet in a client payload is the same as the method for sending a clock synchronization packet in the conventional ethernet, thereby improving compatibility of the FlexE clock synchronization method.

Another example of sending a clock synchronization packet provided in this disclosure is given below.

Figure 9:
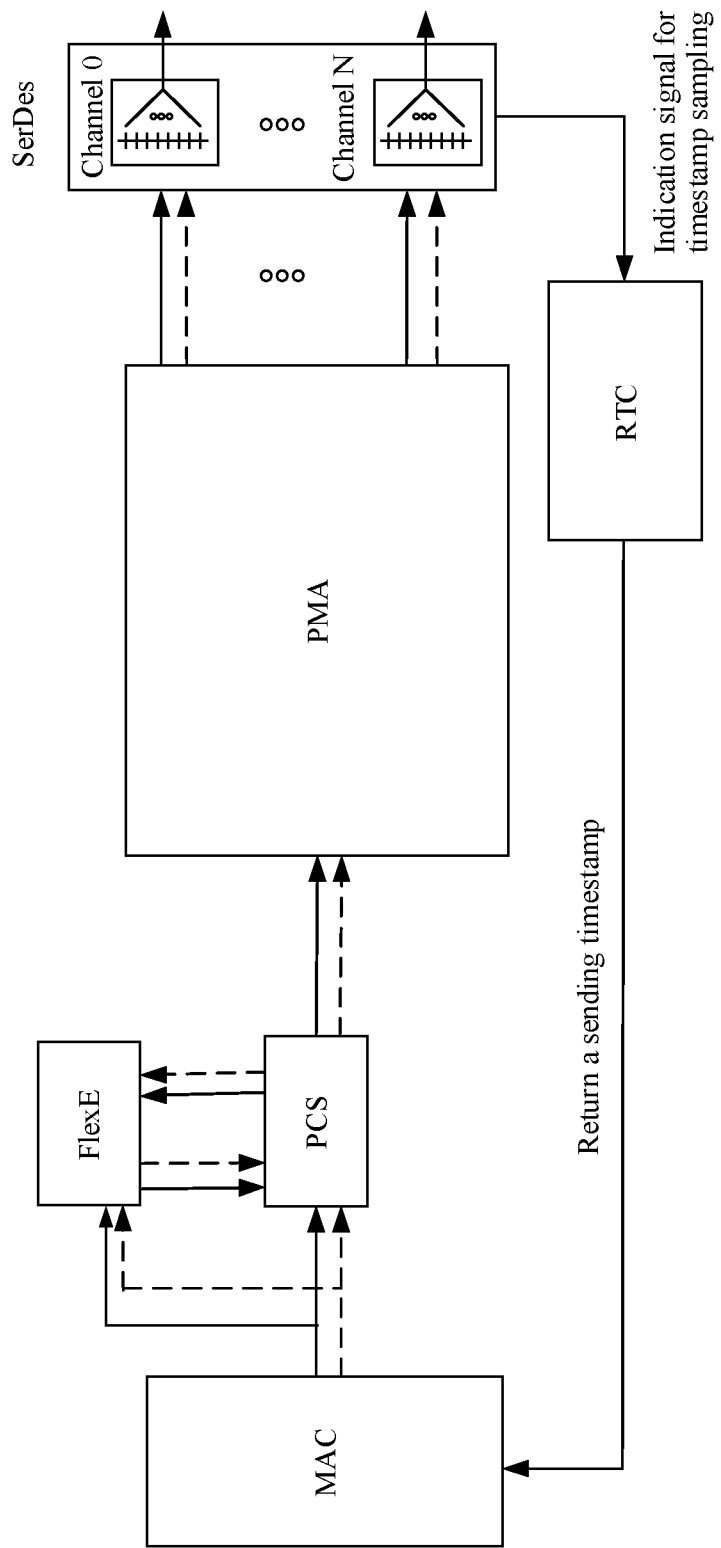
FIG. 9 is another schematic diagram of a method for sending a clock synchronization packet according to this application.

FIG. 9 is another schematic diagram of sending a clock synchronization packet according to this disclosure. As shown in FIG. 9, a dashed-line arrow indicates a flow direction of indication information.

A PTP engine of a MAC module generates a PTP packet, and transmits the PTP packet to a sending unit of the MAC module. After receiving the PTP packet, the sending unit of the MAC module assembles a MAC frame, and marks an SFD location and a timestamp category (48 bits or 80 bits) of the PTP packet. The timestamp category may be one of the following timestamps:

an end-to-end (E2E)/peer-to-peer (P2P) ordinary clock (OC)/boundary clock (BC) T1 original timestamp with a size of 80 bits;

an E2E/P2P transparent clock (TC) output correction timestamp with a size of 48 bits; and a P2P OC/BC T3 correction timestamp with a size of 48 bits.

The sending unit of the MAC module stores a sequence identifier (sequence ID, with a size of 24 bits) of the PTP packet, creates extra out-of-band information accompanying the PTP packet, and sends the information and the PTP packet together.

The forgoing example is merely an example for illustration. In another optional example, a sending unit of a MAC module bypassed by a PTP engine of the MAC module directly sends a PTP packet to a FlexE module (being the same as the MAC in function) that is parallel with the MAC module. The FlexE module writes the PTP packet into an overhead header and transmits the PTP packet through a management channel. This example differs from the clock synchronization solution in the background in that in the solution in the background, both the sending apparatus and the receiving apparatus rely on a boundary of an overhead frame or an overhead multiframe for timestamp sampling. Although a location of the boundary of the overhead frame or the overhead multiframe is relatively stable, padding introduced by an AM or rate adaption still exists. The padding is introduced at a physical layer, resulting in a jitter at the location of the boundary of the overhead frame or the overhead multiframe, and such a jitter is difficult to be predicted through logic. Therefore, an error exists in clock synchronization performed by transmitting a PTP packet through a management channel in the background. However, because of indication information in the solution provided in this disclosure, a location of an SFD of the PTP packet can be tracked in real time and an error caused by the jitter can be accurately compensated.

All modules between the MAC module and the SerDes need to track the location of the SFD of the PTP packet. When the location of the SFD changes due to timeslot mapping, overhead header insertion, or the like, corresponding information is modified.

When the PTP packet arrives at the SerDes, the SerDes sends a signal to an RTC. The RTC performs timestamp sampling based on the signal and a specific packet requirement, records a current time, and sends a timestamp obtained after port latency compensation and asymmetric latency compensation to the MAC module.

The PTP engine of the MAC module writes the timestamp into a follow-up packet and sends the follow-up packet. The timestamp carried in the follow-up packet is a sending timestamp of a last PTP packet obtained after precise measurement.

The method for sending a clock synchronization packet provided in this disclosure is described above. A method for receiving a clock synchronization packet provided in this disclosure is described in detail below.

Figure 10:
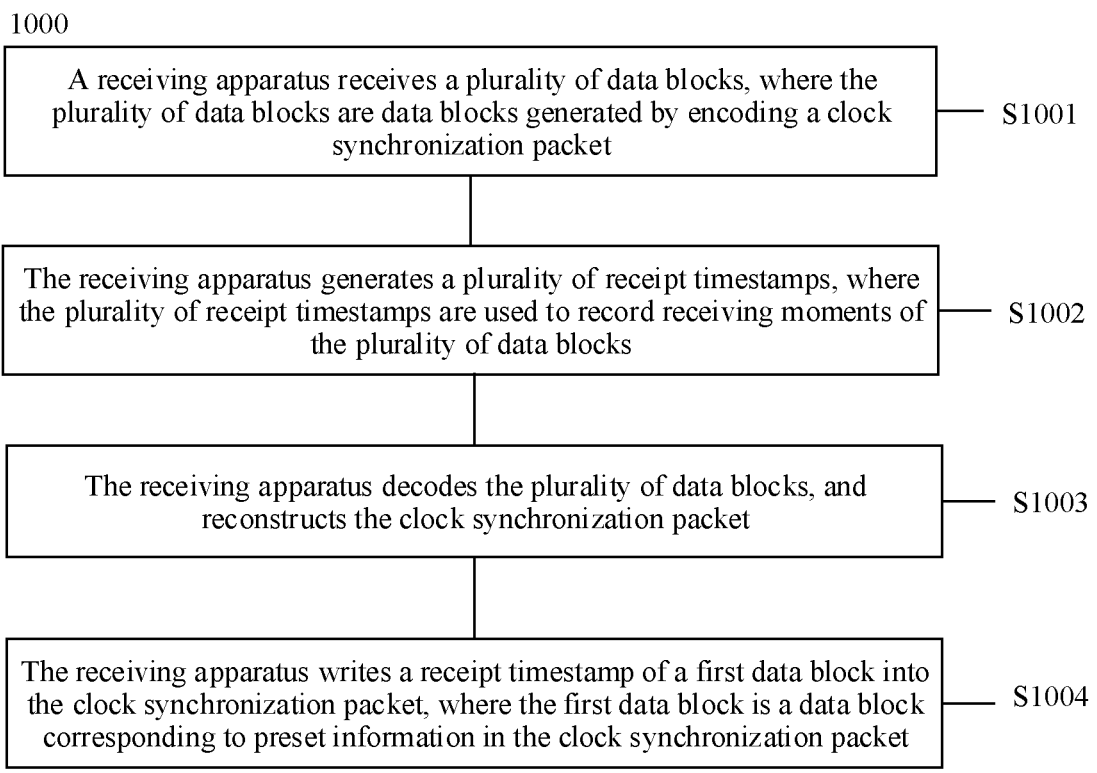
FIG. 10 is a schematic diagram of a method for receiving a clock synchronization packet according to this application.

FIG. 10 shows a method for receiving a clock synchronization packet according to this disclosure. The method 1000 includes the following steps:

S1001. A receiving apparatus receives a plurality of data blocks, where the plurality of data blocks are data blocks generated by encoding a clock synchronization packet.

S1002. The receiving apparatus generates a plurality of receipt timestamps, where the plurality of receipt timestamps are used to record receiving moments of the plurality of data blocks.

S1003. The receiving apparatus decodes the plurality of data blocks, and reconstructs the clock synchronization packet.

S1004. The receiving apparatus writes a receipt timestamp of a first data block into the clock synchronization packet, where the first data block is a data block corresponding to preset information in the clock synchronization packet.

Because the receiving apparatus cannot identify which data block in the plurality of data blocks is the first data block, the receiving apparatus needs to collect a timestamp of data received each time. In other words, the plurality of receipt timestamps are generated. The plurality of receipt timestamps exist as out-of-band information and cannot be deleted until the receiving apparatus identifies the first data block.

In S1003, the receiving apparatus may restore the clock synchronization packet based on an overhead multiframe. For a specific method, refer to a packet restoration method in the prior art. For brevity, details are not described herein.

After the clock synchronization packet is restored, the receiving apparatus may determine that the data block corresponding to the preset information in the packet is the first data block, and writes the timestamp of the first data block into the clock synchronization packet as a receipt timestamp of the clock synchronization packet.

Based on the above analysis of the conventional ethernet clock synchronization solution and the FlexE clock synchronization solution in the background, it may be learned that to improve clock synchronization precision, a data block used for timestamp sampling is pre-agreed by a sending apparatus and the receiving apparatus and cannot be selected at random. In conventional ethernet, a sequence in which data blocks arrive at an MDI of the receiving apparatus does not change. In FlexE, because the data blocks arrive at the MDI of the receiving apparatus in a disordered sequence after being mapped by a time division multiplexing layer in the sending apparatus, the receiving apparatus cannot determine which data block is a pre-agreed data block used for receipt timestamp sampling. Therefore, the industry believes that the FlexE cannot use the clock synchronization method in the conventional ethernet. In the method provided in this embodiment, the receiving apparatus performs timestamp sampling on a data block received in each receive period. After the clock synchronization packet is restored, a timestamp of the data block corresponding to the preset information is used as the receipt timestamp of the clock synchronization packet, to complete receipt timestamp sampling of the clock synchronization packet. Therefore, the clock synchronization method in the conventional ethernet can be applied to the FlexE to overcome the technical bias of the industry. Because the clock synchronization packet may be carried in a non-overhead frame, a quantity of non-overhead frames is far greater than a quantity of overhead frames. Therefore, compared with the FlexE clock synchronization method in the background, the clock synchronization method provided in this embodiment is characterized by high clock synchronization frequency and a wide bandwidth that can be used for transmitting a clock synchronization packet.

Optionally, the preset information is an SFD of the clock synchronization packet.

The sending apparatus and the receiving apparatus may make an appointment to perform timestamp sampling on a data block corresponding to the SFD. This method is the same as the method for performing receipt timestamp sampling in the conventional ethernet, thereby improving compatibility of the FlexE clock synchronization method.

Optionally, a quantity of the plurality of receipt timestamps is less than a quantity of the plurality of data blocks. Before the receiving apparatus writes the receipt timestamp of the first data block into the clock synchronization packet, the method 1000 further includes the following steps:

S1005. The receiving apparatus records a quantity of bits separated between each of the plurality of data blocks and a reference data block, where the reference data block is a data block whose receiving moment is recorded in the plurality of data blocks.

S1006. The receiving apparatus determines the receipt timestamp of the first data block based on a correspondence between a time and a quantity of bits, a quantity of bits separated between the first data block and the reference data block, and a receipt timestamp of the reference data block.

Because data received by the receiving apparatus in each receive period may include a plurality of data blocks, that is, the plurality of data blocks share one receipt timestamp, the data block whose receiving moment is recorded is referred to as the reference data block. In the method provided in this embodiment, the quantity of bits separated between each data block and the reference data block is recorded, and therefore a receiving moment of the first data block may be obtained through calculation based on a correspondence between a bit and a time, in other words, the receipt timestamp of the first data block is determined. In addition, even if a timestamp sampling point in the reference data block is deleted, a location of the timestamp sampling point can be continuously tracked in the method provided in this disclosure.

For example, the receiving apparatus receives eight data blocks in one receive period and performs timestamp sampling when a first data block is received. A quantity of bits included in each data block is 66. After the clock synchronization packet is restored, the receiving apparatus determines that a third data block in the eight data blocks is the data block corresponding to the SFD. A quantity of bits separated between the third data block and the first data block is 132. If a time required for receiving one bit by the receiving apparatus is t, a receiving moment of the third data block is 132t later than a receiving moment of the first data block, and therefore the receiving moment of the first data block may be obtained through calculation.

Optionally, a moment corresponding to any one of the plurality of receipt timestamps is a moment at which a first bit is received in one receive period.

The SFD is a field to be sent first and to be received first in the clock synchronization packet. In the conventional ethernet, the SFD is used as a reference point to perform timestamp sampling. Therefore, the first bit received in the receive period is used as a timestamp sampling point, thereby improving compatibility of the FlexE clock synchronization method.

Optionally, duration of the receive period is equal to a time required by the receiving apparatus for receiving X-bit data, X is a value of a smaller bit width in a bus bit width and a buffer bit width of the receiving apparatus, and the buffer bit width is a buffer bit width of a serial-parallel conversion port of the receiving apparatus.

A smaller bit width indicates a shorter receive period and higher sampling frequency of a receipt timestamp. This is beneficial to improve precision of a finally determined receipt timestamp of the clock synchronization packet.

Optionally, the clock packet is carried in a client payload of the FlexE.

In the method provided in this embodiment, the clock synchronization packet is received by using the client payload of the FlexE. The method is the same as a method for receiving a clock synchronization packet in the conventional ethernet, thereby improving compatibility of the FlexE clock synchronization method.

Another example of receiving a clock synchronization packet provided in this disclosure is given below.

Figure 11:
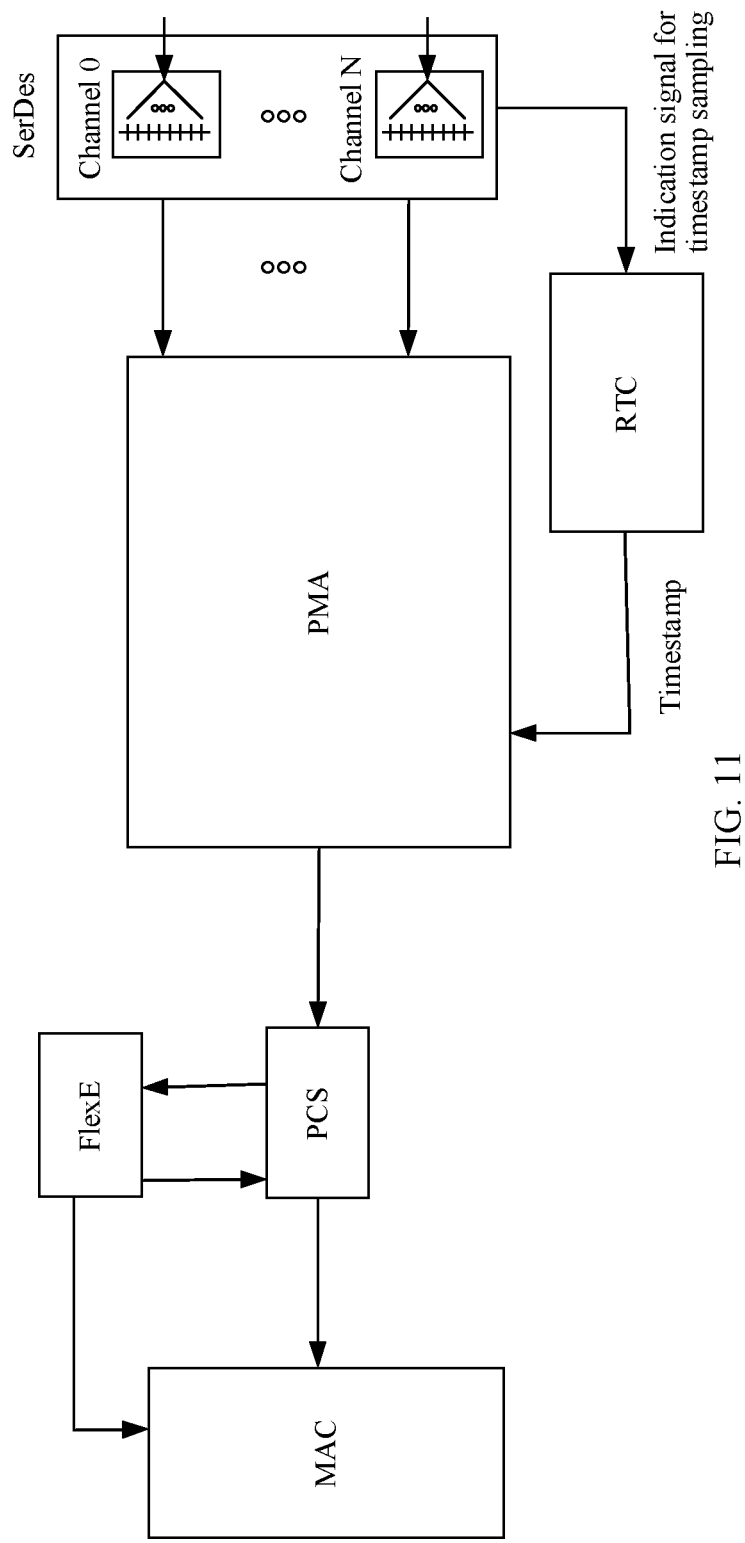
FIG. 11 is another schematic diagram of a method for sending a clock synchronization packet according to this application.

FIG. 11 is another schematic diagram of sending a clock synchronization packet according to this disclosure.

An RTC is responsible for collecting a timestamp of data on each channel and obtaining a timestamp in each receive period. A timestamp sampling point is a first bit received in each receive period and the receive period depends on a data bit width (such as a bus bit width or a buffer bit width) of a receiving apparatus. The timestamp corresponds to a moment at which a SerDes receives a first bit in a current receive period.

The RTC records the timestamp and then sends the timestamp to a PMA. The PMA performs operations such as timeslot mapping and asynchronous processing, reads the timestamp, and records an offset (bit-offset) caused in a processing process. If the PMA can identify a data block corresponding to an SFD, only a timestamp of the data block including the SFD is reserved and another timestamp is discarded. If the PMA cannot identify the data block corresponding to the SFD, it is required to reserve all timestamps and transmit these timestamps to upstream.

A follow-up module needs to track bits (namely, timestamp sampling points) corresponding to the timestamps and record a distance (namely, a quantity of separated bits) between a timestamp sampling point and a first bit of the data block.

After aligning each channel, the PCS obtains a timestamp and an offset on each channel and converts the offset into a time latency compensation timestamp.

Then, if a current FlexE system is a multi-PHY system, a Flex module needs to align a plurality of PHYs and calculate the compensation timestamp. In this case, a packet is restored. The FlexE module may identify whether the current packet is a PTP packet and write the timestamp of the data block corresponding to the SFD into a corresponding bit field of the PTP packet.

A MAC reads the timestamp carried in the PTP packet, corrects the timestamp based on obtained various latencies and compensation, and sends the corrected timestamp as a receipt timestamp of the PTP packet to a path required by the FlexE system.

It should be noted that when the PTP packet is transmitted through a management channel, multi-PHY processing does not need to be performed because the receiving apparatus can clearly learn that the PTP packet exists in which one or more management channels. In addition, in this case, although the PTP packet exists only in the management channel, due to a jitter, the receiving apparatus needs to perform timestamp sampling based on each receive period to obtain a precise timestamp.

Examples of the method for sending and receiving a clock synchronization packet provided in this disclosure are described in detail above. It may be understood that to implement the foregoing functions, a sending apparatus and a receiving apparatus include corresponding hardware structures and/or software modules for performing the functions. A person skilled in the art should easily be aware that, the example units and algorithm steps described with reference to the embodiments disclosed in this specification can be implemented in this disclosure by using hardware or a combination of hardware and computer software. Whether a function is performed by hardware or hardware driven by computer software depends on particular applications and design constraints of the technical solutions. A person skilled in the art may use different methods to implement the described functions for each particular application, but it should not be considered that the implementation goes beyond the scope of this disclosure.

In this disclosure, the sending apparatus and the receiving apparatus may be divided into function units based on the foregoing method examples. For example, each function unit may be obtained through division based on each corresponding function, or two or more functions may be integrated into one processing unit. The integrated unit may be implemented in a form of hardware, or may be implemented in a form of a software functional unit. It should be noted that, in this disclosure, unit division is an example, and is merely logical function division.

In actual implementation, another division manner may be used.

Figure 12:
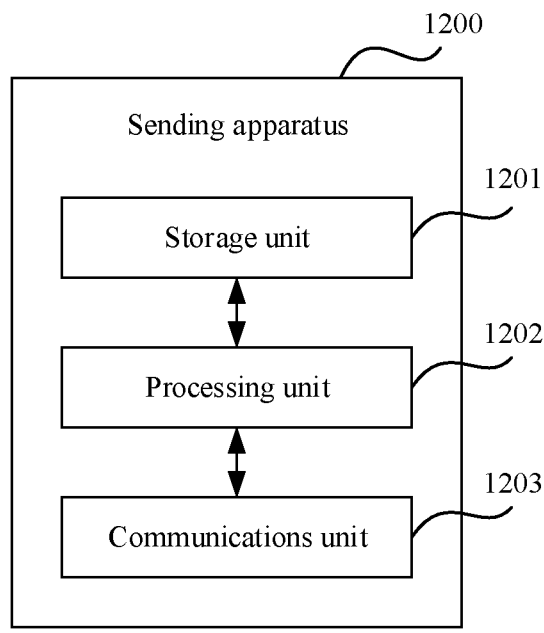
FIG. 12 is a possible schematic diagram of a sending apparatus according to this application.

When an integrated unit is used, FIG. 12 is a possible schematic structural diagram of a sending apparatus in the foregoing embodiment. A sending apparatus 1200 includes a processing unit 1202 and a communications unit 1203. The processing unit 1202 is configured to control and manage an action of the sending apparatus 1200. For example, the processing unit 1202 is configured to support the sending apparatus 1200 in performing S801 and/or another process of the technology described in this specification. The communications unit 1203 is configured to support communication between the sending apparatus 1200 and a receiving apparatus, and communication of each module or unit in the sending apparatus 1200. The sending apparatus 1200 may further include a storage unit 1201, configured to store program code and data of the sending apparatus 1200.

For example, the processing unit 1202 is configured to: generate indication information and a plurality of data blocks, where the plurality of data blocks are obtained by encoding a first clock synchronization packet, the indication information is used to indicate a first data block, and the first data block is a data block used for timestamp sampling in the plurality of data blocks; determine, according to the indication information, a moment at which the first data block arrives at an MDI of the sending apparatus, and generate a sending timestamp, where the sending timestamp is used to record a sending moment of the first clock synchronization packet; and generate a second clock synchronization packet carrying the sending timestamp.

The processing unit 1202 controls the communications unit 1203 to send the second clock synchronization packet.

The processing unit 1202 may be a processor or a controller, such as a central processing unit (CPU), a general-purpose processor, a digital signal processor (DSP), an application-specific integrated circuit (ASIC), a field programmable gate array (FPGA), or another programmable logic device, a transistor logic device, a hardware component, or a combination thereof. The processing unit may implement or execute various example logical blocks, modules, and circuits described with reference to content disclosed in this disclosure. Alternatively, the processor may be a combination of processors implementing a computing function, for example, a combination of one or more microprocessors, or a combination of a DSP and a microprocessor. The communications unit 1203 may be a communications interface or the like. The storage unit 1201 may be a memory.

Figure 13:
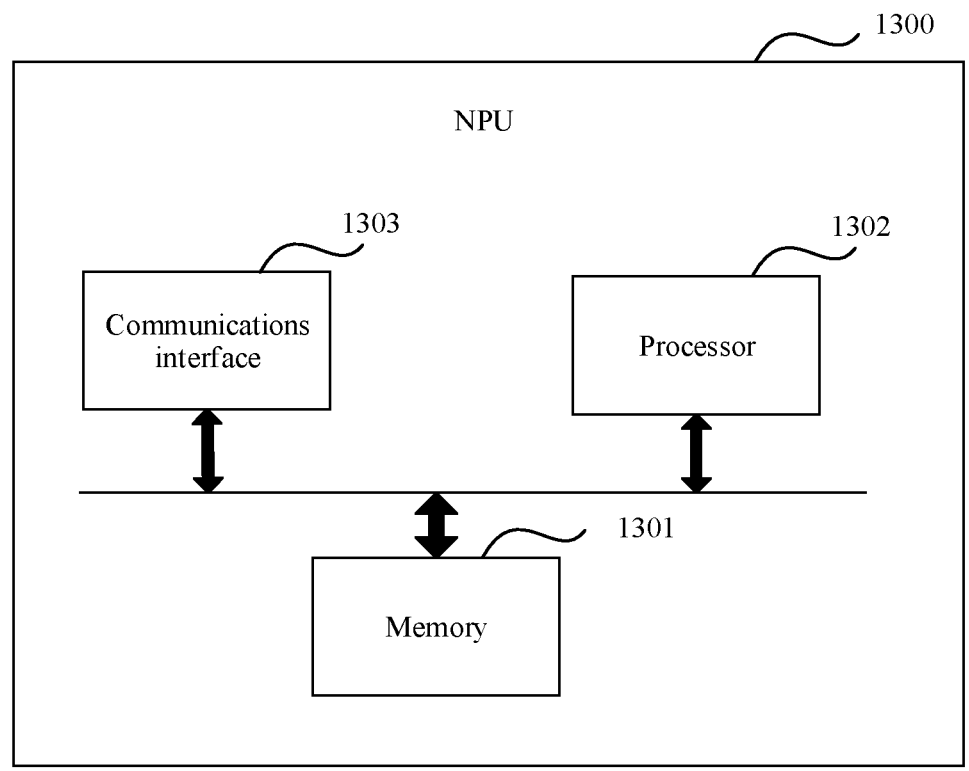
FIG. 13 is another possible schematic diagram of a sending apparatus according to this application.

When the processing unit 1202 is a processor, the communications unit 1203 is a transceiver, and the storage unit 1201 is a memory, the sending apparatus in this disclosure may be an NPU 1300 shown in FIG. 13.

Referring to FIG. 13, the NPU 1300 includes a processor 1302, a communications interface 1303, and a memory 1301. The communications interface 1303, the processor 1302, and the memory 1301 may communicate with each other through an internal connection channel, to transmit a control signal and/or a data signal.

It may be clearly understood by a person skilled in the art that for convenience and brevity of description, for specific working processes of the apparatus and units described above, refer to the corresponding processes in the foregoing method embodiment. Details are not described herein again.

According to the sending apparatus 1200 and the NPU 1300 provided in this disclosure, clock synchronization frequency is increased, a bandwidth that can be used for transmitting a clock synchronization packet is increased, and clock synchronization complexity is reduced. In addition, the sending apparatus 1200 and the NPU 1300 are compatible with an existing clock synchronization standard.

Figure 14:
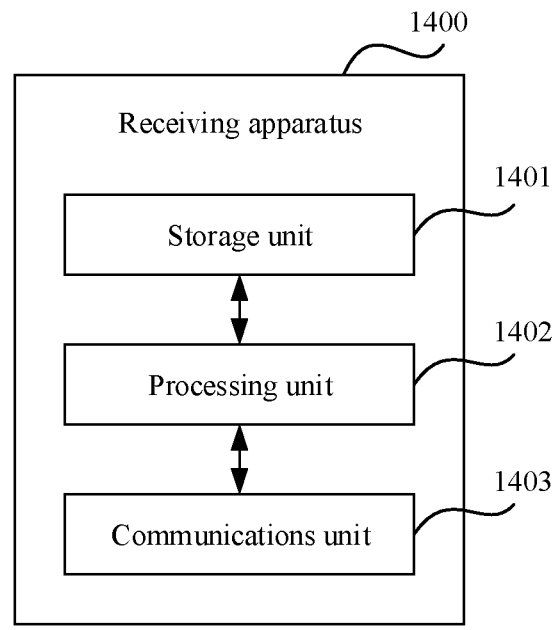
FIG. 14 is a possible schematic diagram of a receiving apparatus according to this application.

When an integrated unit is used, FIG. 14 is a possible schematic structural diagram of a receiving apparatus in the foregoing embodiment. A receiving apparatus 1400 includes a processing unit 1402 and a communications unit 1403. The processing unit 1402 is configured to control and manage an action of the receiving apparatus 1400. For example, the processing unit 1402 is configured to support the receiving apparatus 1400 in performing S1002 and/or another process of the technology described in this specification. The communications unit 1403 is configured to support communication between the receiving apparatus 1400 and a sending apparatus, and communication of each module or unit in the receiving apparatus 1400. The receiving apparatus 1400 may further include a storage unit 1401, configured to store program code and data of the receiving apparatus 1400.

For example, the processing unit 1402 controls the communications unit 1403 to receive a plurality of data blocks, where the plurality of data blocks are data blocks by encoding a clock synchronization packet.

The processing unit 1402 is configured to: generate a plurality of receipt timestamps, where the plurality of receipt timestamps are used to record receiving moments of the plurality of data blocks; decode the plurality of data blocks, and reconstruct the clock synchronization packet; and write a receipt timestamp of a first data block into the clock synchronization packet, where the first data block is a data block corresponding to preset information in the clock synchronization packet.

The processing unit 1402 may be a processor or a controller, such as a CPU, a general purpose processor, a DSP, an ASIC, an FPGA, or another programmable logic device, a transistor logic device, a hardware component, or any combination thereof. The processing unit may implement or execute various example logical blocks, modules, and circuits described with reference to content disclosed in this disclosure. Alternatively, the processor may be a combination of processors implementing a computing function, for example, a combination of one or more microprocessors, or a combination of a DSP and a microprocessor. The communications unit 1403 may be a communications interface or the like. The storage unit 1401 may be a memory.

Figure 15:
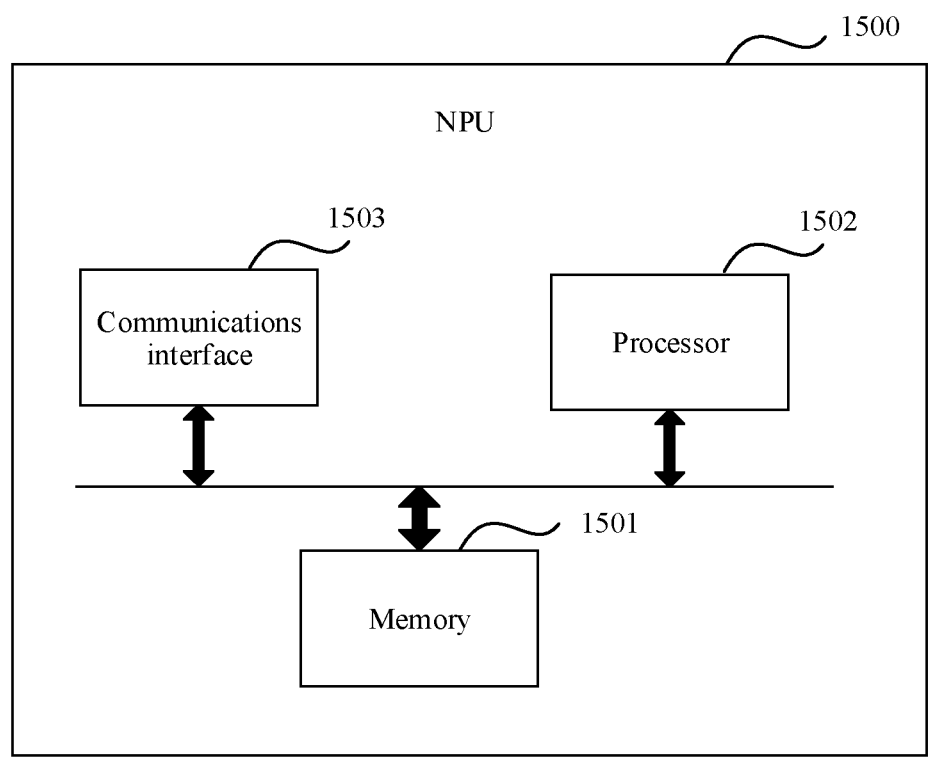
FIG. 15 is another possible schematic diagram of a receiving apparatus according to this application.

When the processing unit 1402 is a processor, the communications unit 1403 is a transceiver, and the storage unit 1401 is a memory, the receiving apparatus in this disclosure may be an NPU 1500 shown in FIG. 15.

Referring to FIG. 15, the NPU 1500 includes a processor 1502, a communications interface 1503, and a memory 1501. The communications interface 1503, the processor 1502, and the memory 1501 may communicate with each other through an internal connection channel, to transmit a control signal and/or a data signal.

It may be clearly understood by a person skilled in the art that for convenience and brevity of description, for specific working processes of the apparatus and units described above, refer to the corresponding processes in the foregoing method embodiment. Details are not described herein again.

According to the receiving apparatus 1400 and the NPU 1500 provided in this disclosure, clock synchronization frequency is increased, a bandwidth that can be used for transmitting a clock synchronization packet is increased, and clock synchronization complexity is reduced. In addition, the receiving apparatus 1400 and the NPU 1500 are compatible with an existing clock synchronization standard.

A sending apparatus or a receiving apparatus in an apparatus embodiment fully corresponds to a sending apparatus or a receiving apparatus in a method embodiment. A corresponding module performs a corresponding step. For example, a sending module or a transmitter performs a sending step in the method embodiment, and a receiving module or a receiver performs a receiving step in the method embodiment. Steps other than the sending and receiving steps may be performed by a processing module or a processor. For a function of a specific module, refer to a corresponding method embodiment. Details are not described herein again.

In the embodiments of this disclosure, the sequence numbers of the processes do not mean execution sequences. The execution sequences of the processes should be determined based on functions and internal logic of the processes, and should not be construed as any limitation on the implementation processes of this disclosure.

In addition, the term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

Method or algorithm steps described with reference to the content disclosed in this disclosure may be implemented by hardware, or may be implemented by a processor by executing a software instruction. The software instruction may include a corresponding software module. The software module may be stored in a random access memory (RAM), a flash memory, a read-only memory (ROM), an erasable programmable read only memory (EPROM), an electrically erasable programmable read only memory (EEPROM), a register, a hard disk, a removable hard disk, a compact disc read-only memory (CD-ROM), or any other form of storage medium well-known in the art. For example, a storage medium is coupled to a processor, so that the processor can read information from the storage medium or write information into the storage medium. Certainly, the storage medium may be a component of the processor. The processor and the storage medium may be located in the ASIC. In addition, the ASIC may be located in a terminal device. Certainly, the processor and the storage medium may exist in a sending apparatus and a receiving apparatus as discrete components.

All or some of the foregoing embodiments may be implemented by using software, hardware, firmware, or any combination thereof. When software is used to implement the embodiments, the embodiments may be implemented all or partially in a form of a computer program product. The computer program product includes one or more computer instructions. When the computer program instruction is loaded and executed on a computer, the procedures or functions in this disclosure are all or partially generated. The computer may be a general-purpose computer, a dedicated computer, a computer network, or another programmable apparatus. The computer instruction may be stored in a computer readable storage medium, or may be transmitted by using the computer readable storage medium. The computer instruction may be transmitted from a website, computer, server, or data center to another website, computer, server, or data center in a wired (for example, a coaxial cable, an optical fiber, or a digital subscriber line (DSL)) manner or a wireless (for example, infrared, radio, or microwave) manner. The computer readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a digital versatile disc (DVD), a semiconductor medium (for example, a solid state disk (SSD)), or the like.

The objectives, technical solutions, and benefits of this disclosure are further described in detail in the foregoing specific implementations. It should be understood that the foregoing descriptions are merely specific implementations of this disclosure, but are not intended to limit the protection scope of this disclosure. Any modification, equivalent replacement, or improvement made based on the technical solutions of this disclosure shall fall within the protection scope of this disclosure.

What is claimed is:

1. A method for sending a clock synchronization packet in flexible Ethernet (FlexE), comprising:
    encoding a clock synchronization packet;
    generating a plurality of data blocks including a first data block for data sampling based on the encoded clock synchronization packet; and
    transmitting the plurality of data blocks in a client payload of FlexE.

2. The method according to claim 1, including generating and transmitting indication information to trigger sampling of the first data block during a receive period of the data block.

3. The method according to claim 2, wherein the indication information comprises one of out-of-band information or in-band information.

4. The method according to claim 2, wherein the indication information indicates a data block associated with a start-of-frame delimiter, SFD.

5. The method according to claim 4, wherein the indication information indicates a data block corresponding to the SFD, or, the indication information indicates a data block corresponding to a first symbol after the SFD.

6. The method according to claim 4, wherein the first data block is a data block associated with the SFD.

7. The method according to claim 6, wherein the first data block is a data block comprising the SFD, or the first data block is a data block comprising the first symbol after the SFD.

8. The method according to claim 1, wherein before the transmitting, by the sending apparatus, the plurality of data blocks carried in the client payload of FlexE, the method further comprises:
determining the first data block according to the indication information; and
obtaining a sending timestamp of the first data block, wherein the sending timestamp is carried in the plurality of data blocks.

9. A method for receiving a clock synchronization packet in flexible Ethernet (FlexE), comprising:
receiving, by a receiving apparatus, a client payload of FlexE that includes a plurality of data blocks that form an encoded clock synchronization packet;
identifying and sampling a first data block in the plurality of data blocks during a receive period of the data block to determine a timestamp.

10. The method according to claim 9, further including receiving indication information to trigger sampling of the first data block.

11. The method according to claim 10, wherein the first data block is a data block corresponding to the indication information or the first data block is a data block corresponding to a first symbol after the indication information.

12. The method according to claim 10 wherein the indication information is a start-of-frame delimiter, SFD.

13. The method according to claim 12, wherein the first data block is a data block associated with the SFD.

14. The method according to claim 13, wherein the first data block is a data block comprising a start-of-frame delimiter SFD or the first data block is a data block comprising the first symbol after the SFD.

15. The method according to claim 9, wherein a quantity of the plurality of receipt timestamps is less than a quantity of the plurality of data blocks, and
before the determining, by the receiving apparatus, a first receipt timestamp corresponding to a first data block, the method further comprises:
recording, by the receiving apparatus, a quantity of bits separated between each of the plurality of data blocks and a reference data block, wherein the reference data block is a data block whose receiving moment is recorded in the plurality of data blocks; and
determining, by the receiving apparatus, the first receipt timestamp of the first data block based on a correspondence between a time and a quantity of bits, a quantity of bits separated between the first data block and the reference data block, and a receipt timestamp of the reference data block.

16. An apparatus for sending a clock synchronization packet in flexible Ethernet, FlexE, comprising:
a processor, configured to execute computer instructions to cause the apparatus to perform the steps of:
encoding a clock synchronization packet;
generating a plurality of data blocks including a first data block for data sampling based on the encoded clock synchronization packet; and
transmitting the plurality of data blocks in a client payload of FlexE.

17. The apparatus according to claim 16, including generating and transmitting indication information.

18. The apparatus according to claim 17, wherein the indication information is out-of-band information or in-band information.

19. The apparatus according to claim 17, wherein the indication information is used to indicate a data block associated with a start-of-frame delimiter, SFD.

20. The apparatus according to claim 19, wherein the indication information is used to indicate a data block corresponding to the SFD, or, the indication information is used to indicate a data block corresponding to a first symbol after the SFD.

21. The apparatus according to claim 19, wherein the first data block is a data block associated with the SFD.

22. The apparatus according to claim 21, wherein the first data block is a data block comprising the SFD, or the first data block is a data block comprising the first symbol after the SFD.

23. A receiving apparatus for receiving a clock synchronization packet in flexible Ethernet, FlexE, comprising:
a processor, configured to execute computer instructions to cause the apparatus to perform the steps of:
receiving, by the receiving apparatus, a client payload of FlexE that includes a plurality of data blocks that form an encoded clock synchronization packet; and
identifying and sampling a first data block in the plurality of data blocks during a receive period of the data block t to determine a timestamp.

24. The receiving apparatus according to claim 23, further including receiving indication information to trigger sampling of the first data block.

25. The receiving apparatus according to claim 24, wherein the first data block is a data block corresponding to the indication information or the first data block is a data block corresponding to a first symbol after the indication information.

26. The receiving apparatus according to claim 24, wherein the indication information is a start-of-frame delimiter, SFD.

27. The receiving apparatus according to claim 26, wherein the first data block is a data block associated with the SFD.

28. The receiving apparatus according to claim 27, wherein the first data block is a data block comprising the SFD or the first data block is a data block comprising the first symbol after the SFD.

29. The receiving apparatus according to claim 23, wherein a quantity of the plurality of receipt timestamps is less than a quantity of the plurality of data blocks, and the processor is configured to cause the apparatus to:
record a quantity of bits separated between each of the plurality of data blocks and a reference data block, wherein the reference data block is a data block whose receiving moment is recorded in the plurality of data blocks; and
determine the receipt timestamp of the first data block based on a correspondence between a time and a quantity of bits, a quantity of bits separated between the first data block and the reference data block, and a receipt timestamp of the reference data block.

* * * * *